United States Patent
Knisley et al.

(10) Patent No.: US 11,289,328 B2
(45) Date of Patent: Mar. 29, 2022

(54) DEPOSITION AND ETCH PROCESSES OF CHROMIUM-CONTAINING THIN FILMS FOR SEMICONDUCTOR MANUFACTURING

(71) Applicant: Applied Materials, Inc., Santa Clara, CA (US)

(72) Inventors: Thomas Knisley, Monroe, MI (US); Mark Saly, Santa Clara, CA (US); Lakmal C. Kalutarage, San Jose, CA (US); David Thompson, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 287 days.

(21) Appl. No.: 16/456,978

(22) Filed: Jun. 28, 2019

(65) Prior Publication Data

US 2020/0006056 A1 Jan. 2, 2020

Related U.S. Application Data

(60) Provisional application No. 62/692,758, filed on Jun. 30, 2018.

(51) Int. Cl.
| | |
|---|---|
| *C23C 16/56* | (2006.01) |
| *H01L 21/02* | (2006.01) |
| *H01L 21/311* | (2006.01) |
| *C23C 16/455* | (2006.01) |

(52) U.S. Cl.
CPC .. *H01L 21/02205* (2013.01); *C23C 16/45553* (2013.01); *C23C 16/56* (2013.01); *H01L 21/02175* (2013.01); *H01L 21/02299* (2013.01); *H01L 21/31116* (2013.01)

(58) Field of Classification Search
None
See application file for complete search history.

(56) References Cited

U.S. PATENT DOCUMENTS

| | | | | |
|---|---|---|---|---|
| 5,130,172 | A | 7/1992 | Hicks et al. | |
| 7,956,207 | B2 | 6/2011 | Meiere | |
| 9,255,327 | B2 * | 2/2016 | Winter | C07F 15/065 |
| 2007/0031609 | A1 * | 2/2007 | Kumar | C23C 16/509 |
| | | | | 427/569 |
| 2008/0113110 | A1 * | 5/2008 | Elers | C23C 16/515 |
| | | | | 427/577 |
| 2011/0159365 | A1 * | 6/2011 | Loveness | H01M 4/1395 |
| | | | | 429/218.1 |
| 2012/0052681 | A1 * | 3/2012 | Marsh | C23C 16/0227 |
| | | | | 438/680 |
| 2012/0108079 | A1 * | 5/2012 | Mahajani | C23C 16/45531 |
| | | | | 438/788 |
| 2015/0004314 | A1 | 1/2015 | Winter et al. | |
| 2015/0198873 | A1 * | 7/2015 | Okubo | G03F 1/54 |
| | | | | 430/5 |

OTHER PUBLICATIONS

Aydinoglu et al. "Chromium oxide as a hard mask material better than metallic chromium" Journal of Vacuum Science and Tec B 35 2017 (Year: 2017).*
Mandol et al. "Atomic layer deposition of chromium oxide—an interplay between deposition and etching" Journal of Vacuum Science and Tech A 39 2021 (Year: 2021).*
PCT International Search Report and Written Opinion in PCT/US2019/039765 dated Oct. 18, 2019, 11 pages.
Fryburg, George C., et al., "Enhancement of Oxidative Vaporization of Chromium (III) Oxide and Chromium by Oxygen Atoms", NASA Report No. TN D-7629, May 1974, 28 pages.
Knisley, Thomas J., et al., "Volatility and High Thermal Stability in Mid to Late First Row Transition Metal Diazadienyl Complexes", Organometallics 2011, 30, pp. 5010-5017.
Tsai, S. C., et al., "Growth mechanism of Cr2O3 scales: oxygen and chromium diffusion, oxidation kinetics and effect of yttrium", Materials Science and Engineering A212 (1996), pp. 6-13.
A Review on Alumina-Chrome (Al2/O3-Cr2O3) and Chrome-Silica (Cr2O3-SiO2) Refractories Along With Their Binary Phase Diagrams Retrieved from the internet: <URL: http://www.idc-online.com/technical_references/pdfs/chemical_engineering/A_Review_on_Alumina_Chrome.pdf>, [retrieved on May 15, 2018], 6 pages.
Pettit, F.S., et al., "Oxidation and Hot Corrosion of Superalloys", Metallurgical and Materials Engineering Department, University of Pittsburgh, Superalloys 1984, 37 pages.

* cited by examiner

*Primary Examiner* — Mandy C Louie
(74) *Attorney, Agent, or Firm* — Servilla Whitney LLC

(57) ABSTRACT

Chromium containing precursors and methods of forming chromium-containing thin films are described. The chromium precursor has a chromium-diazadiene bond or cyclopentadienyl ligand and is homoleptic or heteroleptic. A suitable reactant is used to provide one of a metallic chromium film or a film comprising one or more of an oxide, nitride, carbide, boride and/or silicide. Methods of forming ternary materials comprising chromium with two or more of oxygen, nitrogen, carbon, boron, silicon, titanium, ruthenium and/or tungsten are also described. Methods of filling gaps in a substrate with a chromium-containing film are also described.

20 Claims, No Drawings

DEPOSITION AND ETCH PROCESSES OF CHROMIUM-CONTAINING THIN FILMS FOR SEMICONDUCTOR MANUFACTURING

CROSS-REFERENCE TO RELATED APPLICATIONS

This application claims priority to U.S. Provisional Application No. 62/692,758, filed Jun. 30, 2018, the entire disclosure of which is hereby incorporated by reference herein.

TECHNICAL FIELD

Embodiments of the disclosure generally relate to deposition of chromium-containing thin films. More particularly, embodiments of the disclosure relate to methods of forming chromium-containing films for hardmask and gapfill in semiconductor patterning applications.

BACKGROUND

Etch selective films are required for patterning applications. Films with different dry etch selectivity reduces costly lithography methods that are used for patterning. The ability to etch one film without substantially affecting other films allows for patterning processes with fewer numbers of steps. During device manufacturing one material needs to be etched and not etch other materials in the device. To accomplish this, the materials that need to be protected from the etch process can be covered in a material that shows high etch contrast to the material that needs to be etched. To date, there are not many materials that show high dry etch resistance. Common materials such as SiN, $TiO_2$, $HfO_2$, and $ZrO_2$ are not resistant enough to dry etches to attain the high etch selectivity's required for device manufacturing.

Chromium containing films may give higher dry etch selectivity. Unfortunately, there are a limited number of viable chemical precursors available that have the requisite properties of robust thermal stability, high reactivity, and vapor pressure suitable for film growth to occur. In addition, precursors that often meet these requirements still suffer from poor long-term stability and lead to thin films that contain elevated concentrations of contaminants such as carbon, nitrogen, and/or halides that are often deleterious to the target film application. Therefore, there is a need for improved thin film precursors containing chromium and methods of forming chromium-containing films.

SUMMARY

One or more embodiments of the disclosure are directed to methods of forming a chromium-containing film. A substrate in a processing chamber is exposed to a deposition cycle comprising exposure to a chromium precursor and a reactant. The chromium precursor comprising one or more of a cyclopentadienyl ligand or a complex with a chromium-diazadiene bond with the general structure

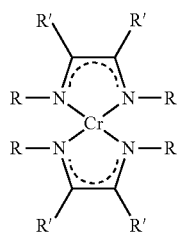

where each R and each R' are independently selected from the group consisting of H, C1-C6 alkyl, aryl, acyl, alkylamido, hydrazido, silyl, aldehyde, keto, C2-C4 alkenyl and/or alkynyl groups.

Additional embodiments of the disclosure are directed to methods of filling a gap with a chromium-containing film. A substrate having at least one feature therein is exposed to a deposition cycle comprising at least one exposure to a chromium precursor and at least one exposure to a reactant. The chromium precursor comprises one or more of a chromium-diazadiene bond or a cyclopentadienyl ligand to form a chromium-containing film on the substrate and in the feature. At least a portion of the chromium-containing film is etched from the substrate, leaving at least a portion of the chromium-containing film in the feature, by exposing the substrate to an oxidant comprising one or more of water, molecular oxygen, peroxide, organic alcohol, ozone, nitrous oxide or plasma versions thereof to form a chromium oxide film. The substrate is held at an elevated temperature to remove the chromium oxide film.

Further embodiments of the disclosure are directed to methods of filling a gap with a chromium-containing film. A substrate having a surface with at least one feature formed therein is provided. The surface of the substrate is selectively poisoned relative to the bottom of the feature to inhibit growth of the chromium-containing film on the surface of the substrate. The substrate is exposed to at least one deposition cycle to form a chromium-containing film. The at least one deposition cycle comprises at least one exposure to a chromium precursor and at least one exposure to a reactant. The chromium precursor comprises one or more of a chromium-diazadiene bond or a cyclopentadienyl ligand. The chromium-containing film is selectively formed in the feature relative to the surface of the substrate.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on a layer formed on the substrate as disclosed in more detail below, and the term "substrate surface" is intended to include such layer as the context indicates. Thus for example, where a film/layer or partial film/layer has been deposited onto a substrate surface, the exposed surface of the newly deposited film/layer may be described as the substrate surface. What a given substrate surface comprises will depend on what materials are to be deposited, as well as the particular chemistry used.

"Atomic layer deposition" or "cyclical deposition" as used herein refers to a process comprising the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction, cycloaddition). The substrate, or portion of the substrate, is exposed sequentially to the two or more reactive compounds which are introduced into a reaction zone of a processing chamber. These reactive compounds may be separated temporally or spatially.

In a time-domain ALD process, exposure to each reactive compound is separated by a time delay to allow each compound to adhere and/or react on the substrate surface and then be purged from the processing chamber. The reactive gases are prevented from mixing by the purging of the processing chamber between subsequent exposures.

In a spatial ALD process, the reactive gases are flowed into different processing regions within a processing chamber. The different processing regions are separated from adjacent processing regions so that the reactive gases do not mix. The substrate can be moved between the processing regions to separately expose the substrate to the processing gases. During substrate movement, different portions of the substrate surface, or material on the substrate surface, are exposed to the two or more reactive compounds so that any given point on the substrate is substantially not exposed to more than one reactive compound simultaneously. As will be understood by those skilled in the art, there is a possibility that a small portion of the substrate may be exposed to multiple reactive gases simultaneously due to diffusion of the gases within the processing chamber, and that the simultaneous exposure is unintended, unless otherwise specified.

In one aspect of a time-domain ALD process, a first reactive gas (i.e., a first precursor or compound A) is pulsed into the reaction zone followed by a first time delay. A second precursor or compound B is pulsed into the reaction zone followed by a second delay. During each time delay, a purge gas, such as argon, may be introduced into the processing chamber to purge the reaction zone or otherwise remove any residual reactive compound or reaction products or by-products from the reaction zone. In some embodiments, the purge gas may flow continuously throughout the deposition process so that only the purge gas flows during the time delay between pulses of reactive compounds. The reactive compounds are alternately pulsed until a predetermined film or film thickness is formed on the substrate surface. In either scenario (discrete purge gas pulses or continuous purge gas flow), the ALD process of pulsing compound A, purge gas, compound B and purge gas may be referred to as a cycle. A cycle can start with either compound A or compound B and may continue the respective order of the cycle until achieving a film with the predetermined thickness.

In one aspect of a spatial ALD process, a first reactive gas and second reactive gas are delivered simultaneously to the reaction zone but are separated by a purge gas curtain and/or a vacuum curtain. The gas curtain can be a combination of inert gas flows into the processing chamber and vacuum stream flows out of the processing chamber. The substrate is moved relative to the gas delivery apparatus so that any given point on the substrate is exposed to the first reactive gas and the second reactive gas.

A "pulse" or "dose" as used herein refers to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

One or more embodiments of the disclosure advantageously provide a new precursor class for depositing chromium-containing films. Some embodiments advantageously provide methods of depositing chromium-containing films using a new class of precursors. In some embodiments, the deposition is by an atomic layer deposition (ALD) process. In some embodiments, the deposition is by a chemical vapor deposition (CVD) process in which both the chromium-containing precursor and the reactants are exposed to the substrate at the same time so that the chromium-containing precursor and reactant are allowed to react in the gas phase.

Some embodiments of the disclosure advantageously provide methods to form etch selective chromium-containing films. Some embodiments of the disclosure advantageously provide methods for gapfill of chromium-containing films. Ability to gap fill while being etch selective may open up new patterning approaches, such as having 3-4 segmented patterning materials on the same etching surface to enable precise Gate/Drain contact patterning and Self-Aligned Double Patterning/Self-Aligned Quadruple Patterning (SADP/SAQP). Some embodiments of the disclosure provide one or more of (1) a new deposition process for a chromium-containing films; (2) a selective etch process for chromium oxide; and/or (3) a method of protecting the chromium oxide film to prevent etching.

Embodiments of the disclosure provide method for the deposition of a chromium-containing film using a selected chromium precursor, and a reductant (chromium metal), an oxidant source (chromium oxide), nitrogen source (chromium nitride), a carbon source (chromium carbide), a silicon source (chromium silicide), a boron source (chromium boride), and/or other metal source (e.g., titanium, tungsten, ruthenium, tin). The deposition process of some embodiments is an ALD process. In some embodiments, the deposition process is a chemical vapor deposition (CVD) process.

Suitable chromium precursors include, but are not limited to, hexacarbonyl chromium (Cr(CO)$_6$), tris(acetylacetonate) chromium (Cr(acac)$_3$), tris(hexafluoroacetylacetonate)chromium (Cr(hfac)$_3$), tris(tetramethylheptanedionate) chromium (Cr(tmhd)$_3$),

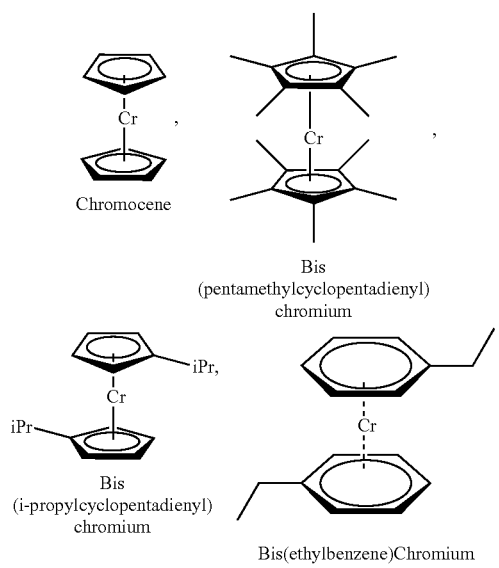

substituted or unsubstituted chromium diazadienyl complexes having the formula

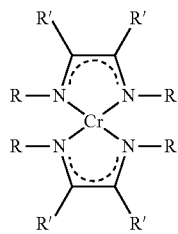

where each R and each R' are independently selected from the group consisting of H, C1-C6 alkyl, aryl, acyl, alkylamido, hydrazido, silyl, aldehyde, keto, C2-C4 alkenyl and/or alkynyl groups. In some embodiments, at least one R or R' is not H. In some embodiments, each of the R' groups are different or each of the R groups are different increasing the rotational entropy of the ligand. As used in this manner, the letter "C" followed by a numeral (e.g., "C4") means that the substituent comprises the specified number of carbon atoms (e.g., C4 comprises four carbon atoms). In some embodiments, at least one of the nitrogen-R groups (labeled R' above) and/or carbon backbone-R groups (labeled R above) is not H. In some embodiments, at least one of the nitrogen-R groups and/or carbon backbone-R groups comprises one or more of a C2-C6 alkyl, a C3-C6 alkyl, a C4-C6 alkyl or a C5-C6 alkyl group.

In some embodiments, a chromium precursor is used to produce one or more of chromium metal (Cr), chromium oxide (CrO), chromium nitride (CrN), chromium carbide (CrC), chromium silicide (CrSi), or a film comprising chromium and having one or more of oxygen (O), nitrogen (N), carbon (C), boron (B) or silicon (Si) atoms. The skilled artisan will recognize that the chemical formula of the chromium film does not imply any particular stoichiometric ratio of atoms unless specifically stated as such. For example, a chromium oxide film may be referred to as "CrO" or "CrO$_x$" and the composition of the film comprises chromium and oxygen atoms. Some embodiments of the disclosure advantageously provide methods of forming ternary materials comprising chromium and two or more of oxygen, nitrogen, carbon, boron, silicon, titanium, tungsten, tin and/or ruthenium atoms. Some examples of ternary materials include, but are not limited to, CrON, CrOC, CrBN, CrSiO, CrBO, CrTiO, CrTiN, CrWN and CrTiW.

In one or more embodiments, the chromium-containing precursor has at least one diazadiene ligand. Diazadiene ligands can adopt several resonance forms when binding to a chromium atom as depicted in scheme (I)

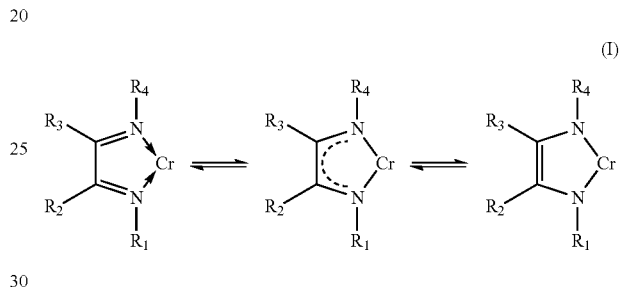

Each of these resonance forms imparts a different electronic charge on the chromium metal center when bonded together in a metal complex. The form on the left containing two double bonds (the diene) is a neutral, nonionic ligand (DAD0). The resonance form in the center of scheme (I) contains a radical resonance structure and is a monoanionic ligand (DAD1). The resonance form on the right of scheme (I) containing a single double bond is a dianionic ligand (DAD2). The skilled artisan will recognize that nitrogen-R groups numbered R1 and R4 in scheme (I) could both be labeled as R groups without inferring that both R groups are the same. Additionally, the skilled artisan will recognize that the backbone-R groups numbered R2 and R3 in scheme (I) could both be labeled as R' groups without inferring that both R' groups are the same.

In some embodiments, at least one of the DAD0, DAD1 and/or DAD2 ligands is symmetrical. As used in this manner, the ligand is symmetrical when the nitrogen-R groups are the same and the carbon backbone-R groups are the same. The nitrogen-R groups can be different than the carbon backbone-R groups. In some embodiments, at least one of the DAD0, DAD1 and/or DAD2 ligands are asymmetrical. An asymmetrical ligand may impart rotational entropy on the chromium complex which may change the vapor pressure and/or reactivity of the species. In some embodiments, the chromium complex is homoleptic. Suitable homoleptic chromium-diazadiene complexes includes compounds with the general formula Cr(DAD)$_2$, where DAD is one or more of DAD0, DAD1 or DAD2.

In some embodiments, a metallic chromium (Cr$^0$) film is formed. In some embodiments, the film formed consists essentially of chromium metal. As used in this manner, the term "consists essentially of chromium" means that the film is greater than or equal to about 95%, 98%, 99% or 99.5%. When measuring the composition of the film, the bulk film properties are measured, excluding the interface regions where atoms from adjacent lays may diffuse into the film. To form a metallic chromium film, the reactant can be any suitable reducing agent, for example, alcohols, ammonia, molecular hydrogen ($H_2$), hydrazine ($N_2H_4$), substituted hydrazines, substituted cyclohexadienes, substituted dihydropyrazines, aluminum-containing molecules, combinations thereof and plasma versions thereof.

In some embodiments, the film formed comprises chromium oxide (CrO). In some embodiments, the film consists essentially of chromium oxide. As used in this manner, the term "consists essentially of" means that the composition of the film is greater than or equal to about 95%, 98%, 99% or 99.5% of the stated elements (in this case chromium and oxygen) in sum on an atomic basis. To form an oxide film, the reactant can be any suitable reactant including, but not limited to, water ($H_2O$), molecular oxygen ($O_2$), peroxides, organic alcohols, ozone ($O_3$), nitrous oxide, combinations thereof and plasmas thereof.

In some embodiments, the film comprises chromium nitride (CrN). In some embodiments, the film consists essentially of chromium nitride. To form a nitride film, the reactant can be any suitable reactant including, but not limited to, ammonia ($NH_3$), hydrazine ($N_2H_4$) substituted hydrazines, combinations thereof and plasmas thereof.

In some embodiments, the film comprises chromium carbide (CrC). In some embodiments, the film consists essentially of chromium carbide. To form a carbide film, suitable reactants include, but are not limited to, alkanes, alkenes, alkynes, substituted versions thereof, combinations thereof and plasmas thereof.

In some embodiments, the film comprises chromium silicide (CrSi). In some embodiments, the film consists essentially of chromium silicide. To form a silicide film, suitable reactants include, but are not limited to, silanes, substituted silanes, siloxanes, silyl halide, silyl amide, combinations thereof and plasmas thereof. Examples of silyl halides include, but are not limited to, dichlorosilane (DCS), hexachloridisilane (HCDS), trichlorosilane (TCS) and $SiCl_4$. Examples of silyl amides include, but are not limited to, bis(diethylamino)silane (BDEAS), bis(tert-butylamino)silane (BTBAS), tetrakis(dimethylamino)silane (TDMAS). In some embodiments, the silicon precursor comprises a species with a general formula $Si_nX_aR_{2n+2-a}$, $Si(NR'_2)_aR_{4-a}$, or a siloxane, where n is 1 to 4, a is 0 to 2n+2, each X is an independently selected halide and each R and R' are independently selected from H, C1-4 alkyl or aryl. Suitable siloxanes include, but are not limited to, hexachlorodisiloxane (HCDSO) and octachlorotrisiloxane (OCTSO). In some embodiments, the silicon precursor consists essentially of silane ($SiH_4$).

In some embodiments, the film comprises chromium boride (CrB). In some embodiments, the film consists essentially of chromium boride. To form a boride film, suitable boron precursors include, but are not limited to, boranes, alkylboranes and haloboranes. In some embodiments, the boron precursor comprises one or more species with a general formula of $B_cH_dX_eR_f$, where each X is a halogen independently selected from F, Cl, Br and I, each R is an independently selected C1-C4 alkyl group, c is any integer greater than or equal to 2, each of d, e and f are less than or equal to c+2 and d+e+f is equal to c+2.

In some embodiments, the film comprises a compound with the general formula $Cr_aB_bC_cN_dO_eSi_f$, where a is in the range of about 1 to about 100 and each of b, c, d, e and f are in the range of about 0 to 100.

In some embodiments, the film comprises an alloy of chromium with another metal. Suitable alloy films that can be formed include, but are not limited to chromium titanate, chromium tungstate, chromium-ruthenium films. In some embodiments, the film comprises chromium and one or more of titanium, tungsten or ruthenium. In some embodiments, the alloy film consists essentially of chromium and a metal comprising one or more of titanium, tungsten or ruthenium.

Some embodiments of the disclosure are directed to methods of forming ternary materials using chromium precursors. In some embodiments, the ternary material comprises chromium and two or more of oxygen, nitrogen, carbon, boron, silicon, titanium, ruthenium and/or tungsten. In some embodiments, the film formed comprises or consists essentially of ruthenium chromium boride. In some embodiments, the ternary material comprises or consists essentially of chromium silicon oxide. In some embodiments, the ternary material layer acts as a catalyst for further surface reactions.

Formation of the ternary material can be accomplished using one or more processes. For example, chromium can be deposited by ALD and another metal (or element) can be deposited by CVD or PVD. The third component, oxygen, nitrogen, carbon, boron, silicon, titanium, ruthenium and/or tungsten can be included with deposition of the chromium or other metal or in a separate process. In some embodiments, the ternary material is formed by forming a laminate of chromium-containing layers and other material layers. For example, a ruthenium chromium boride film may be formed as a laminate of chromium metal layers interspersed with ruthenium boride layers. The titanium precursor, tungsten precursor and/or ruthenium precursor can be any suitable precursors known to the skilled artisan or, for PVD, a suitable target material comprising the selected components.

The period of time that the substrate is exposed to a process gas may be any suitable amount of time to allow formation of the film or a partial film. As used in this manner, "process gases" are any gases or gaseous species that react with the substrate surface or with a chemisorbed molecule on the substrate surface. For example, a process gas may be flowed into the process chamber for a period of about 0.1 seconds to about 90 seconds. In some embodiments, a process gas is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

The temperature of the substrate during deposition can be controlled, for example, by setting the temperature of a substrate support or susceptor. In some embodiments the substrate is maintained at a temperature in the range of about 25° C. to about 500° C., or in the range of about 50° C. to about 450° C., or in the range of about 100° C. to about 400° C., or in the range of about 150° C. to about 350° C., or in the range of about 300° C. to about 300° C.

The chromium precursor can be heated prior to flowing into the processing chamber. For example, the chromium precursor can be contained within a precursor ampoule which is held at an ampoule temperature to increase the vapor pressure of the precursor. An inert or carrier gas can be flowed through the ampoule to draw the precursor to the processing chamber. In some embodiments, the chromium precursor is maintained at a temperature in the range of about 0° C. to about 250° C., or in the range of about 50° C. to about 200° C.

In addition to the foregoing, additional process parameters may be regulated while exposing the substrate to a process gas. For example, in some embodiments, the process chamber may be maintained at a pressure in the range of about 1 mTorr to about 760 Torr, or in the range of about 1 Torr to about 500 Torr, or in the range of about 10 Torr to about 100 Torr.

After exposing the substrate to one process gas, the process chamber (especially in time-domain ALD) may be purged using an inert gas. (This may not be needed in spatial ALD processes as there is a gas curtain separating the reactive gases.) The inert gas may be any inert gas, for example, such as argon, helium, neon, or the like. In some embodiments, the inert gas may be the same, or alternatively, may be different from the inert gas provided to the process chamber during the exposure of the substrate to the first process gas. In embodiments where the inert gas is the same, the purge may be performed by diverting the first process gas from the process chamber, allowing the inert gas to flow through the process chamber, purging the process chamber of any excess first process gas components or reaction byproducts. In some embodiments, the inert gas may be provided at the same flow rate used in conjunction with the first process gas, described above, or in some embodiments, the flow rate may be increased or decreased. For example, in some embodiments, the inert gas may be provided to the process chamber at a flow rate of greater than 0 to about 10000 sccm to purge the process chamber. In spatial ALD, purge gas curtains are maintained between the flows of reactive gases and purging the process chamber may not be necessary. In some embodiments of a spatial ALD process, the process chamber or region of the process chamber may be purged with an inert gas.

The flow of inert gas may facilitate removing any excess process gases and/or excess reaction byproducts from the process chamber to prevent unwanted gas phase reactions. For example, the flow of inert gas may remove excess process gas from the process chamber, preventing a reaction between the chromium precursor and a subsequent process gas.

Then the substrate is exposed to a second process gas for a second period of time. The second process gas may react with the species on the substrate surface. The second process gas may be supplied to the substrate surface at a flow rate greater than the first process gas. In one or more embodiments, the flow rate is greater than about 1 time that of the first process gas, or about 100 times that of the first process gas, or in the range of about 3000 to 5000 times that of the first process gas. The second process gas can be supplied, in time-domain ALD, for a time in the range of about 0.1 sec to about 90 sec, or in the range of about 1 sec to about 60 sec, or in the range of about 10 sec to about 30 sec. The second process gas can be supplied at a pressure in the range of about 1 mTorr to about 760 Torr, or in the range of about 1 Torr to about 500 Torr, or in the range of about 10 Torr to about 250 Torr.

The process chamber may again be purged using an inert gas. The inert gas may be any inert gas, for example, such as argon, helium, neon, or the like. In some embodiments, the inert gas may be the same, or alternatively, may be different from the inert gas provided to the process chamber during previous process steps. In embodiments where the inert gas is the same, the purge may be performed by diverting the second process gas from the process chamber, allowing the inert gas to flow through the process chamber, purging the process chamber of any excess second process gas components or reaction byproducts. In some embodiments, the inert gas may be provided at the same flow rate used in conjunction with the second process gas, described above, or in some embodiments, the flow rate may be increased or decreased. For example, in some embodiments, the inert gas may be provided to the process chamber at a flow rate of greater than 0 to about 10,000 sccm to purge the process chamber.

While the embodiment of the processing method described above includes only two pulses of reactive gases, it will be understood that this is merely exemplary and that additional pulses of process gases may be used. The pulses can be repeated in their entirety or in part. The cycle can be repeated to form a film of a predetermined thickness.

In a prophetic example of a thin film deposition process, a substrate is positioned in a reactor with substrate temperatures held between 25 and 500° C. The selected chromium precursor (held between 0-250° C.) is delivered to a substrate via vapor phase delivery for a pre-determined pulse length (0.1-60 s). During this process, the deposition reactor is operated under a flow of inert carrier gas with the chamber held at a pre-determined temperature (0-500° C.) and pressure (selected between 1 mTorr-760 Torr). After the pulse of the selected chromium precursor, the chamber is then subsequently pumped and purged of all requisite gases and byproducts for a determined amount of time. Subsequently, a co-reactant is pulsed into the chamber for a predetermined pulse length (0.1-60 s) and chamber pressure (1 mTorr-760 Torr). An additional chamber purge is then performed to rid the reactor of any excess reactants and reaction byproducts. This process is repeated as many times as necessary to get the target film to the predetermined film thickness.

In a particular prophetic embodiment, the selected chromium precursor, bis(1,4-ditertbutyldiazadienyl)chromium (II) (held between 0-250° C.) is delivered to a substrate via vapor phase delivery for at pre-determined pulse length of 5 seconds. During this process, the deposition reactor is operated under a flow of nitrogen carrier gas (1000 sccm total) with the chamber held at a pre-determined temperature (350° C.) and pressure (3.5 Torr). After the pulse of the selected chromium precursor, the chamber is then subsequently pumped and purged of all requisite gases and byproducts for a predetermined amount of time. Subsequently, water is pulsed into the chamber for 0.1 seconds at chamber pressure of 3.5 Torr. An additional chamber purge is then performed to rid the reactor of any excess reactants and reaction products and byproducts. This process is repeated as many times as necessary to get the target film to the predetermined film thickness.

Some embodiments of the disclosure are directed to method of etching chromium oxide films. A chromium-containing thin film can be etched using an oxidant source (e.g., water, molecular oxygen, peroxides, organic alcohols, ozone, nitrous oxide, plasmas thereof). The etch process can be performed as an atomic layer etch sequence using alternating pulse and purge steps.

In a prophetic example of an etch process, in a thin film deposition reactor with substrate temperatures are held between 25 and 500° C., the selected oxidant (held between 0-250° C.) is delivered to a substrate via vapor phase delivery for a pre-determined pulse length (0.1-60 s). During this process, the deposition reactor is operated under a flow of inert carrier gas with the chamber held at a pre-determined temperature (0-500° C.) and pressure (selected between 1 mTorr-760 Torr). After the pulse of the selected oxidant, the chamber is then subsequently pumped and purged of all requisite gases and byproducts for a determined amount of time. Subsequently, a co-reactant is pulsed into the chamber for a predetermined pulse length (0.1-60 s) and chamber pressure (1 mTorr-760 Torr). An additional chamber purge is then performed to rid the reactor of any excess reactants and reaction byproducts. This process is repeated as many times as necessary to get the target film to the predetermined film thickness or etch profile.

In another prophetic example, the selected oxidant, oxygen (UHP grade 99.999%) is delivered to a substrate at pre-determined pulse length of 5 seconds. During this process, the deposition reactor is operated under a flow of oxygen gas (500 sccm total) with the chamber held at a pre-determined temperature (350° C.) and pressure (3.5 Torr). After 5 seconds of oxygen flow, a 50 watt oxygen plasma is ignited for an additional 5 seconds, for 10 seconds total. A chamber purge is then performed to rid the reactor of any excess reactants and reaction byproducts. This process is repeated as many times as necessary to get the target film to the predetermined film thickness.

Further embodiments of the disclosure are directed to methods of filling a substrate feature (i.e., a gap) with a chromium-containing material. A gap, as used herein, refers to any intentional surface irregularity in a substrate material. Gaps include, but are not limited to, trenches and vias. During gapfilling processes it is common for the deposited film to pinch-off the opening of the gap resulting in a seam formed in the gap. One method to eliminate or minimize the seam is to prevent deposition on the surface of the substrate so that the gap is filled in a bottom-up manner. The type of surface poisoning depends on, for example, the substrate material and the material being deposited.

In a prophetic embodiment, a substrate having a gap feature is selectively poisoned so that deposition occurs at the top of the feature slower than within the feature. The selected chromium precursor, bis(1,4-ditertbutyldiazadienyl chromium (II) (held between 0-250° C.) is delivered to a substrate via vapor phase delivery for at pre-determined pulse length of 5 seconds. During this process, the deposition reactor is operated under a flow of nitrogen carrier gas (1000 sccm total) with the chamber held at a pre-determined temperature (350° C.) and pressure (3.5 Torr). After the pulse of the selected chromium precursor, the chamber is then subsequently pumped and purged of all requisite gases and byproducts for a determined amount of time. Subsequently, water is pulsed into the chamber for 0.1 seconds at chamber pressure of 3.5 Torr. An additional chamber purge is then performed to rid the reactor of any excess reactants and reaction byproducts. After the CrOx step, it could be envisioned that one may have to repeat the surface poisoning step to refresh the surface. The goal of this is to prevent growth of CrOx on the top features. This process is repeated as many times as necessary to get the target film to the desired film thickness and step coverage profile Additional embodiments of the disclosure are directed to methods of gapfilling with a chromium material using a deposition/etch scheme. By using a deposition/etch scheme, one can utilize the non-homogeneity of a plasma to preferentially etch away the material on the top surface of a three-dimensional feature while leaving the deposited material at the bottom intact. In this instance, CrOx is deposited in a conformal fashion to a predetermined thickness. Thereafter, the etch process is enabled for a specified amount of time to remove a predetermined amount of material. This process is then repeated as many times as necessary to allow one to obtained the desired thickness and step-coverage profile to enable complete fill of a recessed feature. The chromium-containing film can be formed on the substrate and in the feature on the substrate. The film can be partially removed from the surface of the substrate leaving at least some of the film in the feature of the substrate so that more of the film is removed from the surface than from the bottom of the feature. The substrate temperature can be elevated to volatilize the chromium oxide film so that the film can be removed from the processing chamber.

In a prophetic example, in a thin film deposition reactor with substrate temperatures are held between 25 and 500° C., the selected oxidant (held between 0-250° C.) is delivered to a substrate via vapor phase delivery for a pre-determined pulse length (0.1-60 s). During this process, the deposition reactor is operated under a flow of inert carrier gas with the chamber held at a pre-determined temperature (0-500° C.) and pressure (selected between 1 mTorr-760 Torr). After the pulse of the selected oxidant, the chamber is then subsequently pumped and purged of all requisite gases and byproducts for a determined amount of time. Subsequently, a co-reactant is pulsed into the chamber for a predetermined pulse length (0.1-60 s) and chamber pressure (1 mTorr-760 Torr). An additional chamber purge is then performed to rid the reactor of any excess reactants and reaction byproducts. This process is repeated as many times as necessary to get the target film to the predetermined film thickness or etch profile.

In another prophetic example, the selected oxidant, oxygen (UHP grade 99.999%) is delivered to a substrate at pre-determined pulse length of 5 seconds. During this process, the deposition reactor is operated under a flow of oxygen gas (500 sccm total) with the chamber held at a pre-determined temperature (350° C.) and pressure (3.5 Torr). After 5 seconds of oxygen flow, a 50 watt oxygen plasma is ignited for an additional 5 seconds, for 10 seconds total. A chamber purge is then performed to rid the reactor of any excess reactants and reaction byproducts. This process is repeated as many times as necessary to get the target film to the predetermined film thickness Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a chromium-containing film, the method comprising:
    exposing a substrate in a processing chamber to a deposition cycle comprising exposure to a chromium precursor and a reactant to form a chromium oxide containing film;

exposing the substrate to an etch process comprising exposing the chromium oxide containing film to an oxidant, wherein, the chromium precursor comprising one or more of a compound with a cyclopentadienyl ligand or a complex having a chromium-diazadiene bond and the general structure

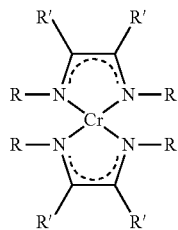

where each R and each R' are independently selected from the group consisting of H, C1-C6 alkyl, aryl, acyl, alkylamido, hydrazido, silyl, aldehyde, keto, C2-C4 alkenyl and/or alkynyl groups, and the oxidant comprises one or more of water, molecular oxygen, peroxide, an organic alcohol, ozone, nitrous oxide or a plasma version thereof.

2. The method of claim 1, wherein the chromium precursor and the reactant are exposed to the substrate separately.

3. The method of claim 2, wherein the chromium precursor and an oxygenating agent are separated temporally.

4. The method of claim 2, wherein the chromium precursor and an oxygenating agent are separated spatially.

5. The method of claim 1, wherein the chromium precursor comprises a homoleptic chromium-diazadiene complexes includes compounds with the general formula $Cr(DAD)_2$, where DAD is a diazadiene.

6. The method of claim 5, wherein the chromium precursor comprises a compound with the general formula

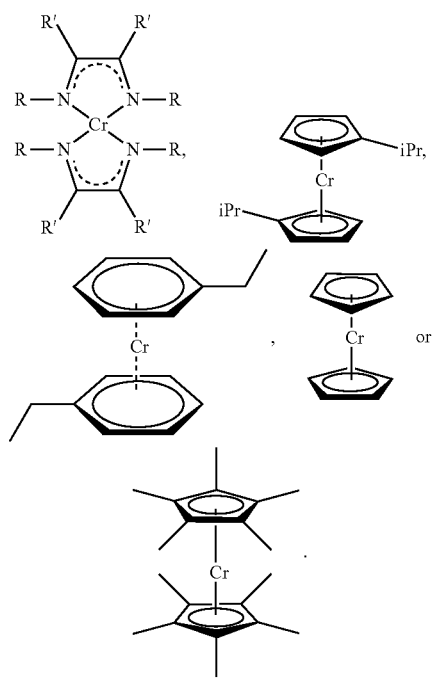

7. The method of claim 6, wherein the chromium precursor comprises a heteroleptic chromium-diazadiene complex.

8. The method of claim 6, wherein the chromium precursor comprises a homoleptic chromium-diazadiene complex.

9. The method of claim 8, wherein the chromium precursor comprises bis(1,4-ditertbutyldiazadienyl)chromium(II).

10. The method of claim 1, wherein the film further comprises one or more of chromium metal, nitride, carbide, boride or silicide.

11. The method of claim 1, wherein the reactant comprises one or more of water, molecular oxygen, peroxide, an organic alcohol, ozone, nitrous oxide or a plasma version thereof.

12. The method of claim 11, wherein the reactant further comprises one or more of ammonia, hydrazine, a substituted hydrazine or plasma versions thereof and the chromium-containing film comprises chromium nitride.

13. The method of claim 11, wherein the reactant further comprises one or more of an alkane, alkene, alkyne, substituted alkane, substituted alkene, substituted alkyne or plasma versions thereof and the chromium-containing film comprises chromium carbide.

14. The method of claim 11, wherein the reactant further comprises one or more of a silane, substituted silane or plasma versions thereof and the chromium-containing film comprises chromium silicide.

15. The method of claim 1, wherein the chromium-containing film is a hard mask.

16. A method of filling a gap with a chromium oxide-containing film, the method comprising:

exposing a substrate having at least one feature therein to a deposition cycle comprising at least one exposure to a chromium precursor and at least one exposure to a reactant, the chromium precursor comprising a chromium-diazadiene bond or a cyclopentadienyl ligand, the reactant comprising an oxidizing agent to form a chromium oxide-containing film on the substrate and in the feature; and etching at least a portion of the chromium oxide-containing film from the substrate and leaving at least a portion of the chromium oxide-containing film in the feature by further exposing the substrate to an oxidant comprising one or more of water, molecular oxygen, peroxide, organic alcohol, ozone, nitrous oxide or plasma versions thereof to form a chromium oxide film and holding the substrate at an elevated temperature to remove the chromium oxide film.

17. A method of filling a gap with a chromium-containing film, the method comprising:

providing a substrate having a surface with at least one feature formed therein;

poisoning the surface of the substrate selectively relative to a bottom of the feature to inhibit growth of the chromium-containing film on the surface of the substrate;

exposing the substrate to at least one deposition cycle to form a chromium oxide-containing film, the at least one deposition cycle comprising at least one exposure to a chromium precursor and at least one exposure to a reactant, the chromium precursor comprises one or more of a chromium-diazadiene bond or a cyclopentadienyl ligand, and the reactant comprises one or more of water, molecular oxygen, peroxide, an organic alcohol, ozone, nitrous oxide or a plasma version thereof, to selectively form the chromium oxide-containing film in the feature relative to the surface of the substrate; and exposing the chromium oxide-containing film to an etch process comprising exposing the chromium oxide containing film to an oxidant.

18. The method of claim 1, wherein the chamber is maintained at a temperature of 0-500° C. independently during one or more of the deposition process or the etch process.

19. The method of claim 1, wherein the chamber is maintained at a pressure of 1 mTorr-760 Torr independently during one or more of the deposition process or the etch process.

20. The method of claim 11, wherein the reactant further comprises one or more of an alcohol, ammonia, molecular hydrogen, hydrazine, substituted hydrazine, substituted cyclohexadiene, substituted dihydropyrazine, aluminum-containing molecules or plasma versions thereof and the chromium-containing film is metallic chromium.

\* \* \* \* \*